United States Patent
Yamamoto et al.

(10) Patent No.: US 7,609,126 B2
(45) Date of Patent: Oct. 27, 2009

(54) DIODE SWITCH AND ATTENUATOR FOR REDUCING A BIAS CURRENT

(75) Inventors: Kazuya Yamamoto, Tokyo (JP); Miyo Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 513 days.

(21) Appl. No.: 11/465,866

(22) Filed: Aug. 21, 2006

(65) Prior Publication Data

US 2007/0053136 A1    Mar. 8, 2007

(30) Foreign Application Priority Data

Sep. 2, 2005    (JP)    ............... 2005-255573

(51) Int. Cl.
  *H03H 7/25*    (2006.01)
(52) U.S. Cl. ..................................... 333/81 R; 333/262
(58) Field of Classification Search ............... 333/81 R, 333/81 A, 262, 101, 103; 327/308, 309, 327/365

See application file for complete search history.

(56) References Cited

U.S. PATENT DOCUMENTS

| 6,577,177 B2 * | 6/2003 | Zhou et al. .................. 327/317 |
| 2007/0268096 A1 | 11/2007 | Yamamoto et al. |
| 2008/0088392 A1 | 4/2008 | Yamamoto et al. |

FOREIGN PATENT DOCUMENTS

JP    2004-320352    11/2004

\* cited by examiner

*Primary Examiner*—Stephen E Jones
(74) *Attorney, Agent, or Firm*—Leydig, Voit & Mayer, Ltd.

(57) ABSTRACT

Diodes and are connected between an input terminal and an output terminal. These diodes are connected in parallel, and the cathode of a latter-stage diode is connected to the anode of a former-stage diode through a capacitor. Specifically, from the DC point of view, the diodes are serially connected, and, from the AC point of view, the diodes are connected in parallel through the capacitor.

14 Claims, 13 Drawing Sheets

FIG. 20B $$\int_0^{T/2} I(t)\,dt = Imax/(\pi * f) < Idc * \tau \quad (1)$$

FIG. 21

DIODE SWITCH AND ATTENUATOR FOR REDUCING A BIAS CURRENT

BACKGROUND OF THE INVENTION

1. Field of the Invention

The present invention relates to a diode switch and an attenuator, and specifically, to a diode switch and an attenuator fabricated using a GaAs substrate, and that can reduce a bias current while maintaining allowable transmission power.

2. Background Art

In recent years, as a power amplifier for mobile phones or a power amplifier for wireless LAN represented by CDMA (code division multiple access), GaAs-HBT power amplifier (HBT: heterojunction bipolar transistor) has been widely used.

Since GaAs-HBT requires no negative gate bias voltage, it can be operated by a single power source, and can provide more uniform device characteristics than FET systems. Therefore, in recent years, it has been increasingly applied to GaAs power amplifiers for those represented by mobile phones and wireless LAN.

However, when an RF (high frequency) switch element is constituted using a normal GaAs-HBT process, an FET switch that can turn the channel ON only by applying gate voltage, cannot be formed. Therefore, for example, in Japanese Unexamined Patent Publication No. 2004-320352, a diode switch using base-collector junction having a junction near p-i-n junction is used as a substitute is disclosed.

Figure 19A:
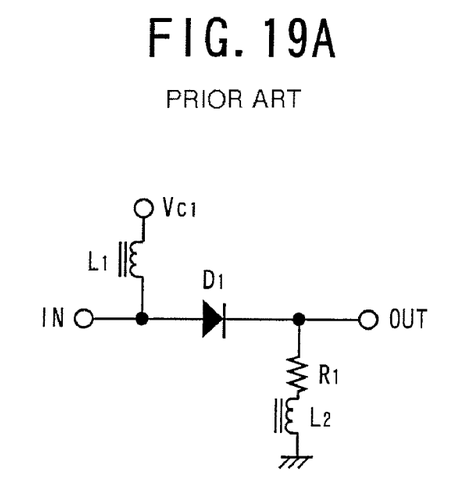
FIGS. 19A and 19B show examples of a diode switch using a base-collector diode of a conventional art.
Figure 19B:
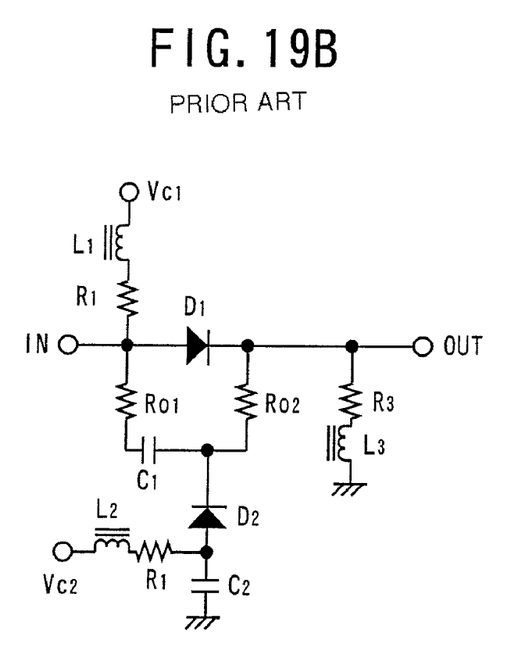

FIGS. 19A and 19B show examples of a switch using the base-collector diode (BC diode), and a circuit using an attenuator, respectively. In these drawings, each of D1 and D2 denotes a BC diode; each of L1 to L3 denotes a RF blocking inductor; each of R1, R2, R01 and R02 denotes a resistor; each of C1 and C2 denotes a capacitor; IN and OUT denote an input terminal and an output terminal, respectively; and each of Vc1 and Vc2 denotes a control voltage terminal.

In the circuit shown in FIG. 19A, when a voltage not lower than the ON voltage of D1 (about 1.25 V) is applied to Vc1, a current Idc determined by the resistor R1 flows. Then, D1 turns from the OFF state to the ON state, and RF power inputted from IN is transmitted to OUT. On the contrary, when a voltage not higher than the ON voltage (including negative bias) is applied to Vc1, D1 turns to the OFF state, and the transmission of RF power is blocked.

In the circuit shown in FIG. 19B, when a voltage not lower than the ON voltage of D1 is applied to Vc1, and a voltage not higher than the ON voltage (including negative bias) of D2 is applied to Vc2, a passing state is formed. On the contrary, when a voltage not higher than the ON voltage of D1 is applied to Vc1, and a voltage not lower than the ON voltage is applied to Vc2, an attenuating state determined by the ON resistance of resistors R01, R02 and D2 is formed. However, when capacitors C1 and C2 are formed on a GaAs chip, the capacitor value is limited to relatively small capacity. Therefore, the impedance value of C1 and C2 in the operating frequency band also becomes the factor to determine the attenuating amount.

Figure 20A:
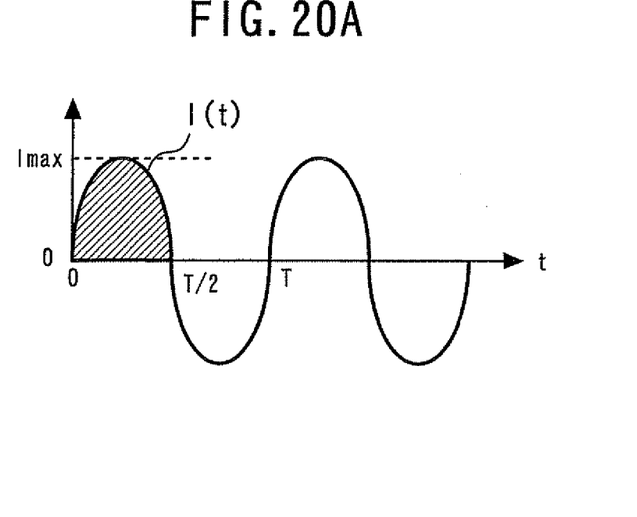
FIGS. 20A, 20B and 21 show examples of passing power characteristics of a diode switch.
Figure 20B:
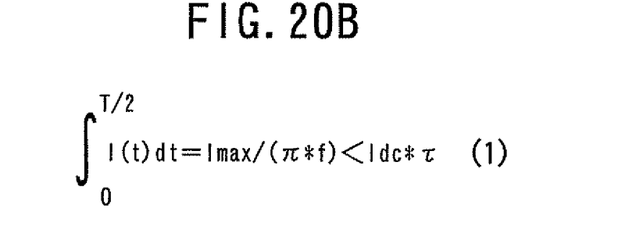
Figure 21:
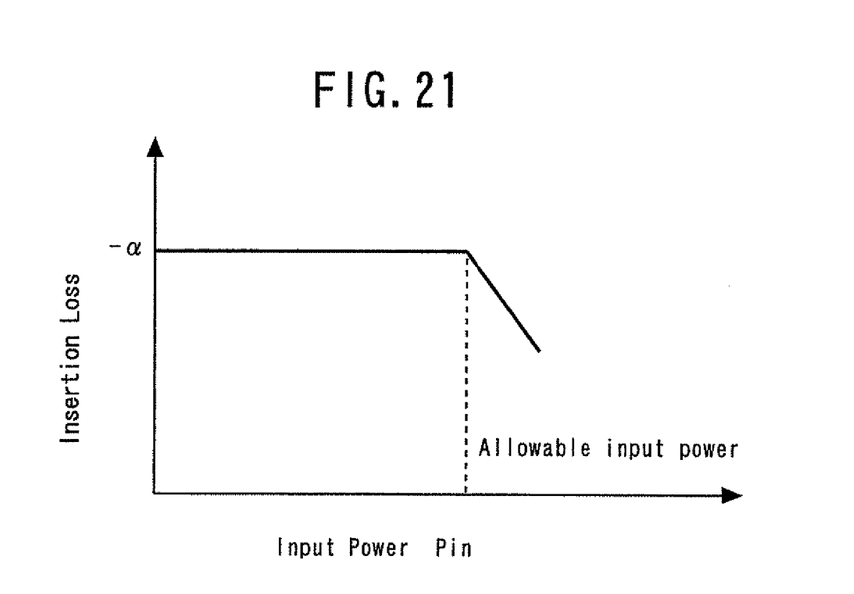

Here, the examples of passing power characteristics of a diode switch are as shown in FIGS. 20 and 21. When a certain bias current Idc is flowed in the diode D1, the allowable input power of the level wherein insertion loss does not increase at the bias current value thereof is limited.

Equation (1) in FIG. 20B shows the limitation. The left side of Equation (1) is the time integration value of the half wave of current I (t) passing through the diode, that is a value corresponding the total electric charge amount in the half wave. The right side of Equation (1) is the product of time constant $\tau$ determined by the joining material and joined state of the diode (concentration and thickness of i layer (high-resistance layer) or the like) and the bias current value Idc.

Specifically, the above-described allowable input power is limited to a value smaller than the product of the time constant $\tau$ and the bias current value Idc.

As a result, under the condition of the same bias current value, only smaller power can be passed as the frequency is lower. Particularly when a BC diode is fabricated using a GaAs-HBT process, since the BC layer is determined by the RF characteristics of the HBT, the freedom for designing the structure of the BC layer is narrowed.

When compared with an Si p-i-n diode, the time constant $\tau$ of GaAs p-i-n diode is intrinsically about two digits smaller, the allowable input power (allowable transmission power in a switch) becomes considerably smaller. As a result, when a BC diode is applied to an RF switch or an RF attenuator, a large bias current must be flowed to obtain a desired allowable transmission power.

In the above-described conventional diode switches and attenuators, there was a problem wherein when a BC diode fabricated using a GaAs-HBT process was applied to an RF switch or an RF attenuator, compared with the case using an Si p-i-n diode, a considerably large bias current was required.

SUMMARY OF THE INVENTION

The present invention has been developed to solve the above-described problems, and therefore it is an object of the present invention to provide a diode switch and an attenuator operated by a smaller bias current compared with the RF switch or attenuator of a conventional configuration.

The above object is achieved by a diode switch that includes an input terminal and an output terminal, a set of diodes connected between the input terminal and the output terminal, a control voltage terminal connected between the input terminal and the set of diodes, the diode switch outputting to the output terminal an RF power inputted from the input terminal when an equal to or higher than a predetermined voltage is applied to the control voltage terminal, the set of diodes are arranged in a plurality of stages including a former stage and a latter stage connected in parallel, the cathode of the latter stage diode is connected to the anode of the former stage diode through a first capacitor so that a common DC current flows through the former stage diode and the latter stage diode.

The above object is achieved by an attenuator that includes an input terminal and an output terminal, a first set of diodes connected between the input terminal and the output terminal, a first control voltage terminal connected between the input terminal and the first set of diodes, a resistance element connected to the first set of diodes, a second control voltage terminal and a second set of diodes connected to the resistance element, the attenuator outputting to the output terminal attenuating an RF power inputted from the input terminal when an equal to or lower than a predetermined voltage is applied to the first control voltage, and an equal to or higher than a predetermined voltage is applied to the second control voltage terminal, the first set of diodes are arranged in a plurality of stages including a former stage and a latter stage connected in parallel, the cathode of the latter stage diode is connected to the anode of the former stage diode through a first capacitor so that a common DC current flows through the former stage diode and the latter stage diode, the second set of diodes are arranged in a plurality of stages including a former stage and a latter stage connected in parallel, the second set of diodes are connected to the resistance element through a capacitor so that a common DC current flows through the former stage diode and the latter stage diodes.

According to the present invention, in order to obtain a desired allowable transmission power, the RF switch or attenuator can be operated by about half or smaller bias current compared with those of conventional configurations.

Other features and advantages of the invention will be apparent from the following description taken in connection with the accompanying drawings.

DETAILED DESCRIPTION OF THE PREFERRED EMBODIMENTS

Embodiments of the present invention will be described below referring to the drawings. In the drawings, the same or equivalent parts will be denoted by the same reference numerals, and the description thereof will be simplified or omitted.

First Embodiment

Figure 1A:
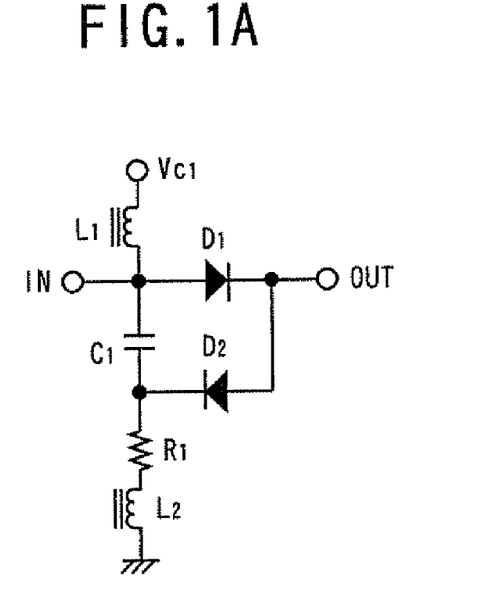
FIGS. 1A and 1B show basic circuit configurations of diode switches according to the first embodiment.
Figure 1B:
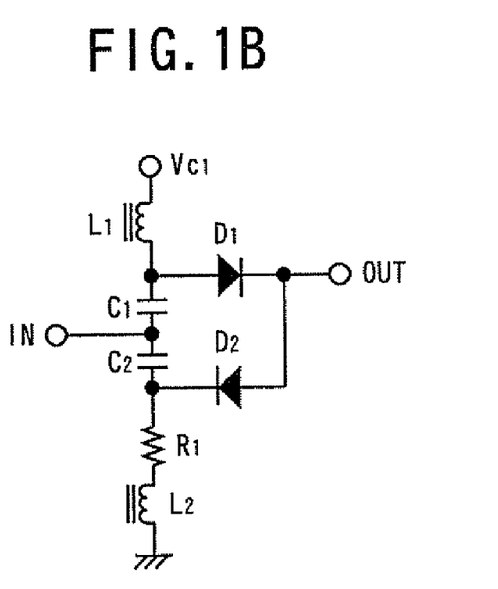

FIGS. 1A and 1B show basic circuit configurations of diode switches according to the first embodiment. In these drawings, each of D1 and D2 denotes a base-collector diode (hereafter referred to as "BC diode" or simple "diode"). Each of L1 and L2 denotes an RF (high frequency) blocking inductor; each of R1 denotes a resistor; and each of C1 and C2 denotes a capacitor.

As FIG. 1A shows, diodes D1 and D2 are connected between an input terminal (IN) and an output terminal (OUT). These diodes are connected in parallel, and the cathode of the latter-stage diode (D2) is connected to the anode of the former-stage diode (D1) through a first capacitor (C1). Between the input terminal (IN) and the diodes D1 and D2, a control voltage terminal (Vc1) is connected. In this switch, when a voltage not lower than a predetermined voltage is applied to the control voltage terminal (Vc1), an RF power inputted from the input terminal (IN) is outputted to the output terminal (OUT).

In the circuit shown in FIG. 1B, a second capacitor (C1) is installed between the first-stage diode (D1) and the input terminal (IN). (For the convenience of description, in FIG. 1B, the first capacitor is denoted by C2, and the second capacitor is denoted by C1.) Other configuration is identical to the configuration shown in FIG. 1A.

The diodes D1 and D2 shown in FIGS. 1A and 1B are serially connected in the DC (direct current) point of view, and are connected in parallel through the capacitor C1 (or capacitors C1 and C2) in the AC (alternate current) point of view. By such a configuration, when the control voltage terminal Vc1 is turned High, the DC bias current Idc flows through D1 and D2 in common. However, in the AC point of view, since the Idc equivalent to twice flows, the Idc of Equation (1) shown in FIG. 20B is apparently twice Idc.

As a result, the allowable transmission power is improved to about 4 times when Idc flows in the conventional art circuit (refer to FIG. 19). This can be known from the fact that the Imax of the RF current in FIG. 20A becomes about twice, and the allowable transmission power can be expressed by Ro·Imax·Imax/2 (Ro is the characteristic impedance of the system.).

Figure 2:
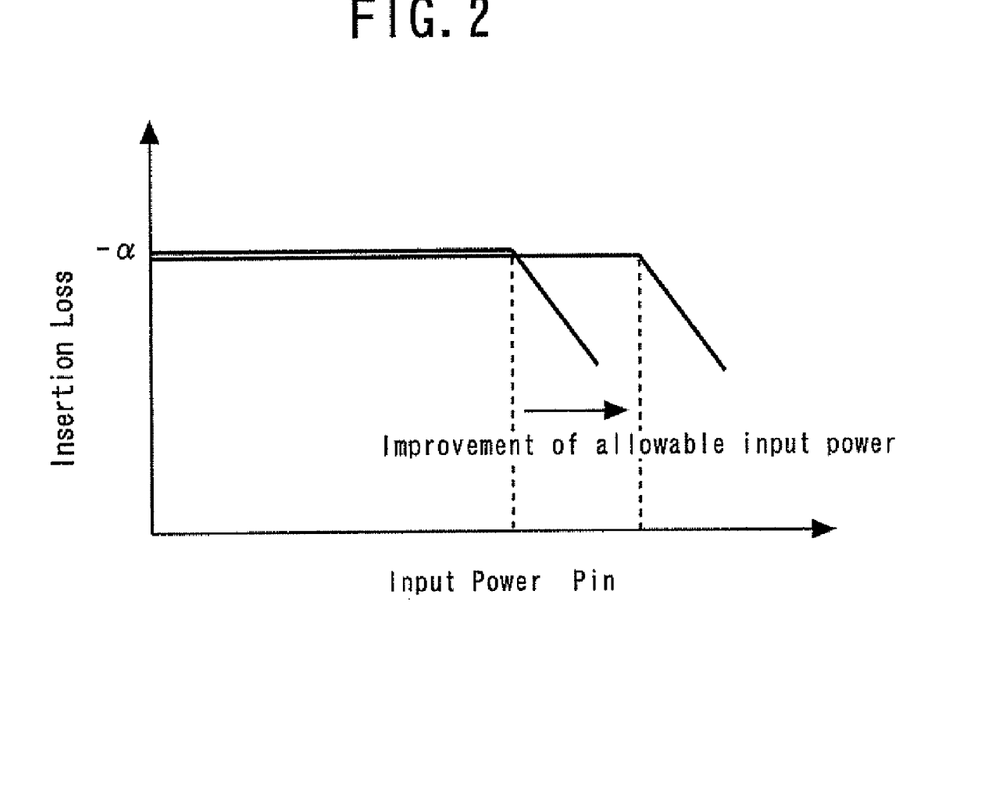
FIG. 2 shows the insertion loss versus the input power of the circuit configuration shown in FIGS. 1A and 1B.

FIG. 2 shows the insertion loss (Loss) versus the input power (Pin) of the circuit configuration shown in FIG. 1. When characteristics of circuits in FIGS. 1A and 1B are compared, the insertion loss of the circuit configuration in FIG. 1A is smaller to a certain extent. However, the isolation is slightly improved in the circuit of FIG. 1B than in FIG. 1A. By these circuit configurations, the bias current for obtaining the same allowable input power can be almost halved comparing with the RF switch of a conventional configuration.

In FIGS. 1A and 1B, examples using two-stage diodes were shown. However, the effect to improve allowable transmission power can also be obtained when three-stage diodes, or diodes of more stages are used.

Second Embodiment

Figure 3A:
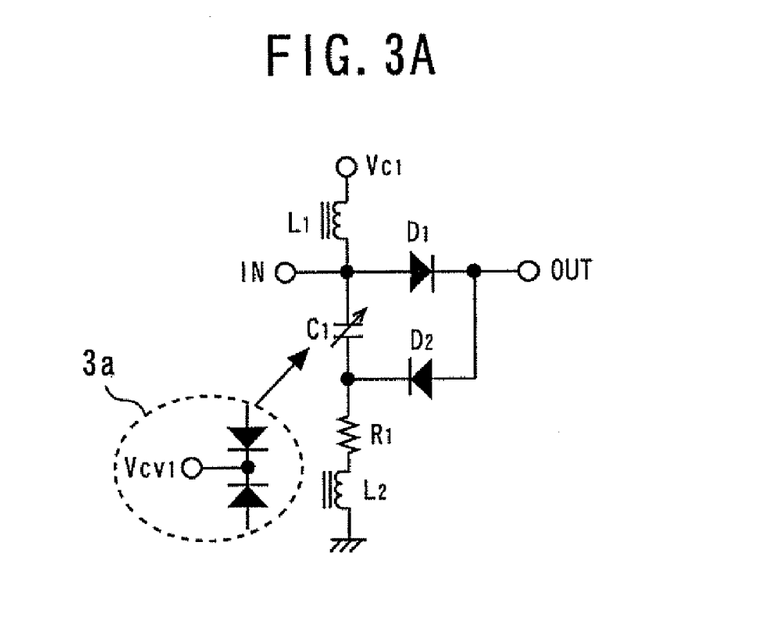
FIGS. 3A and 3B show basic circuit configurations of diode switches according to the second embodiment.
Figure 3B:
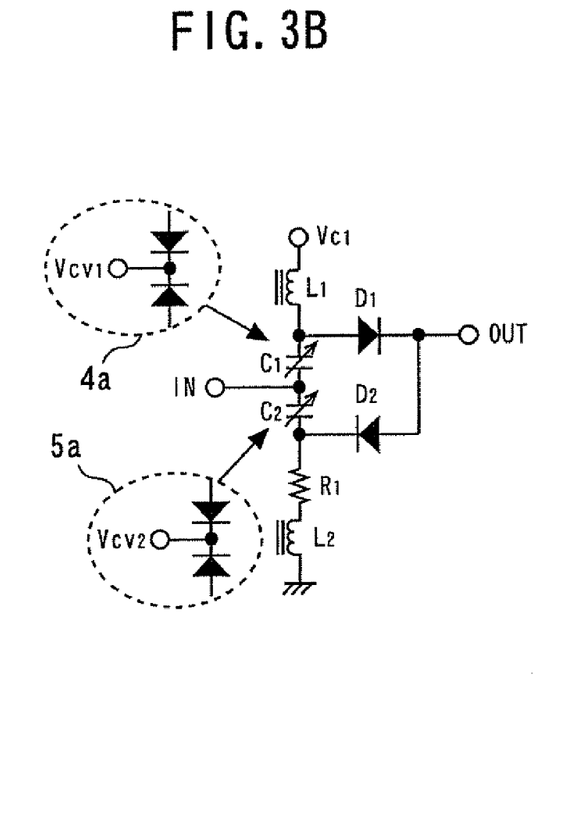

FIGS. 3A and 3B show basic circuit configurations of diode switches according to the second embodiment.

FIG. 3A shows the first capacitor (C1) shown in FIG. 1A whose capacity is made to be variable. For example, the first capacitor C1 is composed of anti-series diodes shown in dotted-line circle 3a, and reverse bias is applied to the anti-series diodes through the common terminal Vcv1.

FIG. 3B shows the second capacitor (C1) and the first capacitor (C2) shown in FIG. 1B whose capacity is made to be variable. For example, these capacitors are composed of anti-series diodes shown in dotted-line circle 4a and 5a, respectively, and reverse bias is applied to the anti-series diodes through the common terminal Vcv1 and Vcv2.

In the above-described circuit configurations, the reverse bias voltage in the RF blocking state is made to be higher than the reverse bias voltage applied to Vcv1 and Vcv2 in the RF passing state, the capacities of C1 and C2 are reduced. Thereby, the isolation characteristics can be improved.

By the above-described configurations, in addition to the effect of the first embodiment, isolation in the RF blocking state of the switch can be improved.

Third Embodiment

Figure 4:
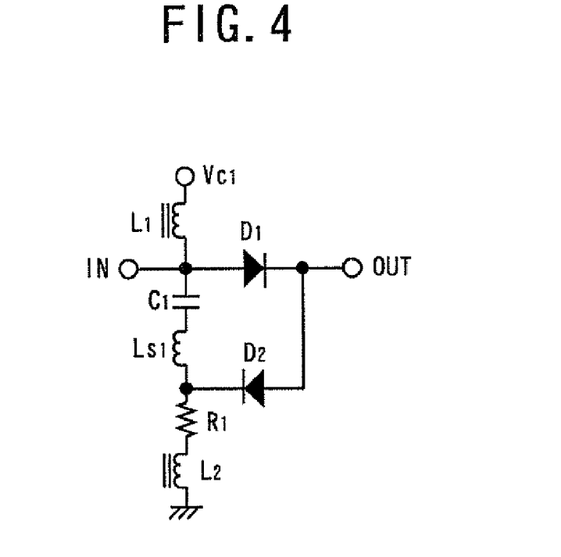
FIG. 4 shows a basic circuit configuration of a diode switch according to the third embodiment.

FIG. 4 shows a basic circuit configuration of a diode switch according to the third embodiment. This circuit is a circuit wherein an inductor Ls1 serially resonating with the first capacitor (C1) in the circuit shown in FIG. 1A at a desired frequency is inserted between C1 and R1, serially to the first capacitor (C1).

In the above-described circuit configuration, when Ls1 and C1 are allowed to resonate serially at a desired frequency, impedance can be more reduced than the case of FIG. 1A (than the case of C1 alone). Thereby, in addition to the effect of the first embodiment, the passage loss of the RF power passing through the diode D2 side can be improved. Therefore, the insertion loss of the entire switch can be reduced.

Fourth Embodiment

Figure 5:
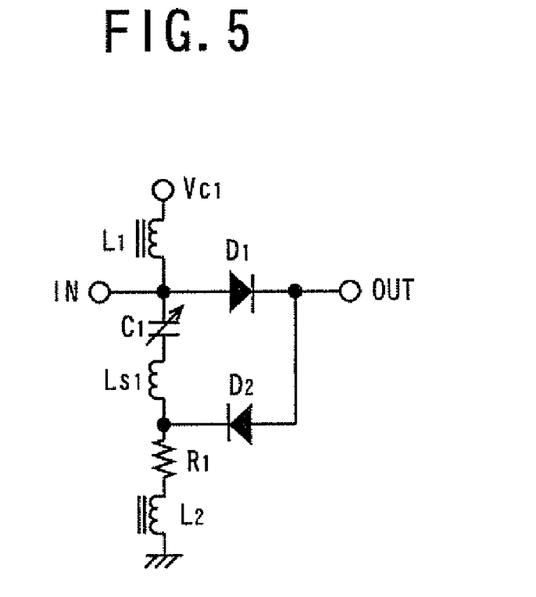
FIG. 5 shows a basic circuit configuration of a diode switch according to the fourth embodiment.

FIG. 5 shows a basic circuit configuration of a diode switch according to the fourth embodiment. This circuit is a circuit wherein the capacity of the first capacitor (C1) in the circuit shown in the third embodiment (refer to FIG. 4) is made to be variable.

By the above-described configurations, as in the second embodiment, isolation in the RF blocking state of the switch can be improved. Therefore, in addition to the effect of the first and third embodiments, isolation in the RF blocking state of the switch can be improved.

Fifth Embodiment

Figure 6:
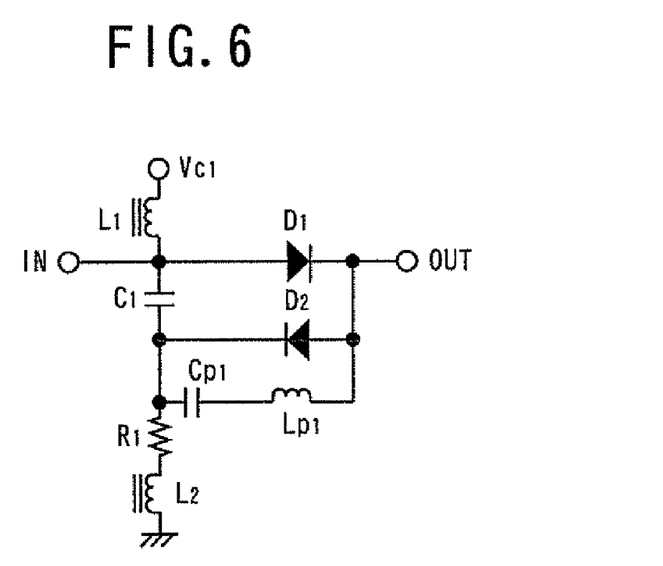
FIG. 6 shows a basic circuit configuration of a diode switch according to the fifth embodiment.

FIG. 6 shows a basic circuit configuration of a diode switch according to the fifth embodiment. This circuit is a circuit wherein a capacitor Cp1 and an inductor Lp1 are serially inserted in the location parallel to the diodes D1 and D2 in the circuit shown in FIG. 1A of the first embodiment.

The capacity of Cp1 is a value showing a sufficiently low impedance at a desired frequency. Lp1 is selected so as to resonate in parallel with the joint capacity in the RF blocking state of the diodes D1 and D2, and the first capacitor C1 at a desired frequency.

By the above-described configuration, the diodes D1 and D2, the first capacitor C1, and the inductor Lp1 resonate in parallel in the RF blocking state. Thereby, in comparison with the circuit shown in FIG. 1A of the first embodiment, isolation characteristics in the RF blocking state can be significantly improved.

Therefore, in addition to the effect of the first embodiment, isolation in the RF blocking state can also be significantly improved.

Sixth Embodiment

Figure 7:
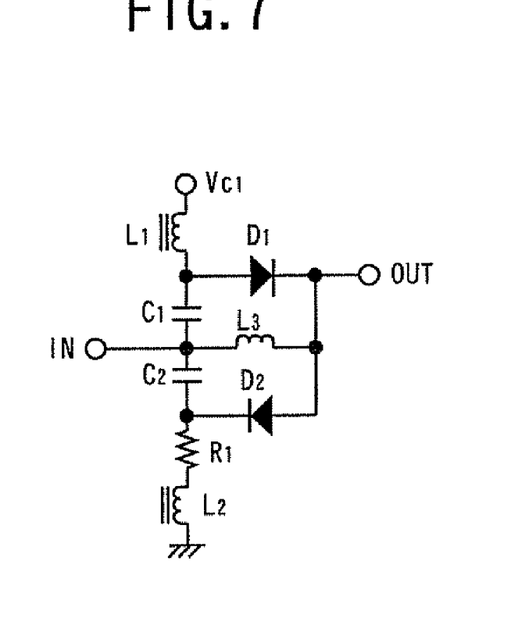
FIG. 7 shows a basic circuit configuration of a diode switch according to the sixth embodiment.

FIG. 7 shows a basic circuit configuration of a diode switch according to the sixth embodiment. This circuit is a circuit wherein an inductor L3 is inserted in parallel to the diodes D1 and D2, in the circuit shown in FIG. 1B of the first embodiment. One terminal of L3 is connected to a point between the second capacitor C1 and the first capacitor C2, and the other terminal of L3 is connected to a point between the diodes D1 and D2.

L3 is selected so as to resonate in parallel with the joint capacity in the OFF state (RF blocking state) of the C1, D1, C2, and D2, at a desired frequency.

By the above-described configuration, the diodes D1 and D2, the first capacitor (C2), the second capacitor (C1), and the inductor L3 resonate in parallel in the RF blocking state. Thereby, in comparison with the circuit shown in FIG. 1B of the first embodiment, isolation characteristics in the RF blocking state can be significantly improved.

Therefore, in addition to the effect of the first embodiment, the isolation characteristics in the RF blocking state can also be significantly improved.

Seventh Embodiment

Figure 8:
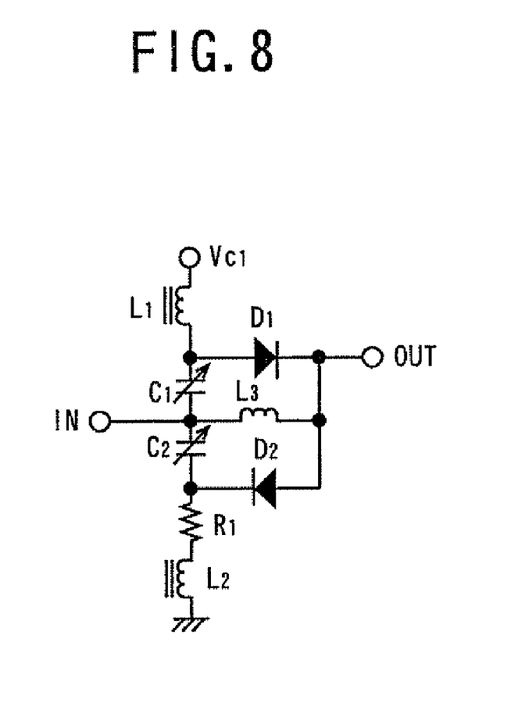
FIG. 8 shows a basic circuit configuration of a diode switch according to the seventh embodiment.

FIG. 8 shows a basic circuit configuration of a diode switch according to the seventh embodiment. This circuit is a circuit wherein the capacity of the first capacitor C2 and the second capacitor C1 in the circuit shown in the sixth embodiment (refer to FIG. 7) is made to be variable.

By the above-described configuration, the passage loss in the RF passing state can be varied. Thereby, in addition to the effect of the sixth embodiment, the insertion loss in the RF passing state can be made variable.

Eighth Embodiment

Figure 9:
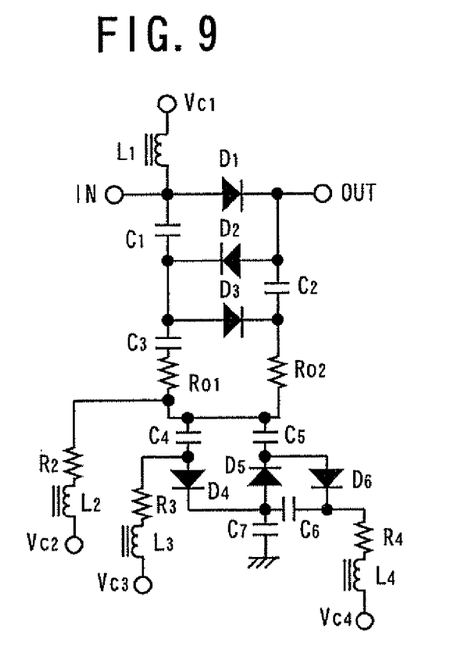
FIG. 9 shows a basic circuit configuration of a diode attenuator according to the eighth embodiment.

FIG. 9 shows a basic circuit configuration of a diode attenuator according to the eighth embodiment. In this circuit, the case wherein three stages of diode switches are used is shown. Each of D1 to D6 denotes a diode, each of C1 to C7 denotes a capacitor, each of R1 to R4, R01 and R02 denotes a resistor, each of L1 to L4 denotes an RF blocking inductor, and each of Vc1 to Vc4 denotes a control voltage terminal.

As FIG. 9 shows, first diodes D1, D2 and D3 are connected between an input terminal (IN) and an output terminal (OUT). These diodes are multistage diodes connected in parallel. Between the first diodes D1, D2 and D3, and the input terminal (IN), a first control voltage terminal (Vc1) is connected.

The cathode of the diode D2 is connected to the anode of the diode D1 through a first capacitor C1. Similarly, the cathode of the diode D3 is connected to the anode of the diode D2 through a first capacitor C2. Specifically, the cathode of the latter-stage diode is connected to the anode of the former-stage diode through a first capacitor. (Here, for the convenience of description, both C1 and C2 are referred to as first capacitors.)

Resistors R01 and R02 are connected to the first diodes D1, D2 and D3. To these resistors, a second control voltage terminal Vc2 is connected.

To the resistors R01 and R02, second diodes D4, D5 and D6 are connected through capacitors C4 and C5. These diodes are multistage diodes connected in parallel. Between the diode D4 and the capacitor C4, a third control voltage terminal Vc3 is connected. To the diode D6, a fourth control voltage terminal Vc4 is connected.

Specifically, the above-described circuit is a circuit wherein the diode D1 in FIG. 19B is substituted by the first diodes D1 to D3 (vertically stuck diodes), and the diode D2 in FIG. 19B is substituted by the second diodes D4, D5 and D6 (vertically stuck diodes).

The operation of this circuit will be described below. When the voltage applied to the first control voltage terminal Vc1 and the fourth control voltage terminal Vc4 is High, and the voltage applied to the second control voltage terminal Vc2 and the third control voltage terminal Vc3 is Low, the first diodes D1 to D3 are in the ON state, the second diodes D4 to D6 are in the OFF state, and the RF passing state is created. On the other hand, when the voltage applied to the first control voltage terminal Vc1 and the fourth control voltage terminal Vc4 is Low, and the voltage applied to the second control voltage terminal Vc2 and the third control voltage terminal Vc3 is High, the first diodes D1 to D3 are in the OFF state, the second diodes D4 to D6 are in the ON state, and the RF attenuating state is created.

At this time, by connecting the capacitors C4 and C5 are connected as FIG. 9 show, the common node of R01 and R02 can be isolated from the diodes D4 and D5 in a DC point of view (specifically, the DC path composed of the first diode D1, D2 and D3 can be isolated from the DC path composed of the second diode D4, D5 and D6), and the diode D4 can be isolated from the diode D5 in a DC point of view.

By the above-described configuration, as in the first embodiment, the bias current to obtain the same allowable transmission power can be reduced.

In the circuit shown here, although an example wherein the first and second diodes are three-stage diodes is shown, the similar effects can be obtained if these diodes are two-stage diodes.

Ninth Embodiment

Figure 10:
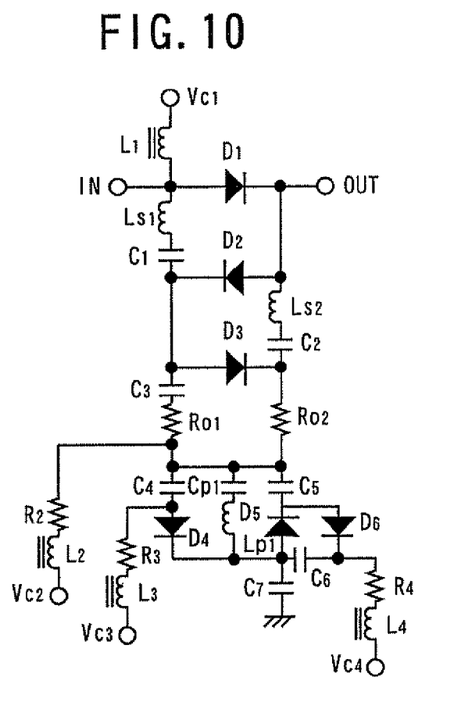
FIG. 10 shows a basic circuit configuration of a diode attenuator according to the ninth embodiment.

FIG. 10 shows a basic circuit configuration of a diode attenuator according to the ninth embodiment. This circuit is a circuit wherein inductors Ls1 and Ls2 are inserted in the locations serial to the first capacitors C1 and C2, respectively, in the circuit shown in the eighth embodiment (refer to FIG. 9). Further, an inductor Lp1 and a capacitor Cp1 are serially inserted in the location parallel to the second diodes D4, D5 and D6.

Inductors Ls1 and Ls2 are selected so as to serially resonate with the first capacitors C1 and C2, respectively, at a desired frequency. Cp1 is selected so as to be AC short-circuiting at a desired frequency.

By loading the above-described Ls1, LS2 and Lp1, as in the third and fourth embodiments, insertion loss in the RF passing state can be improved.

Also as in the eighth embodiment, the bias current to obtain the same allowable transmission power can be reduced. Therefore, in addition to the effect of the eighth embodiment, insertion loss in the RF passing state can be improved.

Tenth Embodiment

Figure 11:
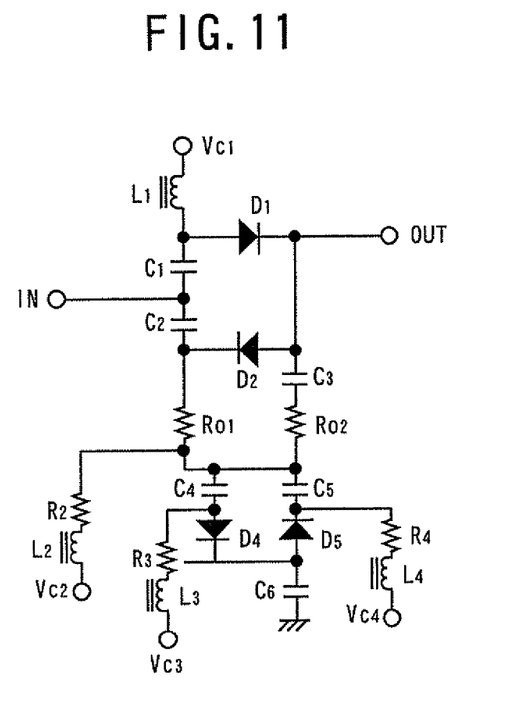
FIG. 11 shows a basic circuit configuration of a diode attenuator according to the tenth embodiment.

FIG. 11 shows a basic circuit configuration of a diode attenuator according to the tenth embodiment. This circuit has a circuit wherein the RF switch shown in FIG. 1B of the first embodiment is applied to the attenuator shown in FIG. 19B. Specifically, the circuit has a structure wherein a second capacitor C1 is installed between the diode D1 and the input terminal (IN) in the circuit shown in FIG. 9.

Here, by connecting C4 and C5 as FIG. 11 shows, the common node of R01 and R02 can be isolated from the diodes D4 and D5 in DC point of view (specifically, the DC path consisting of diodes D1 and D2 is isolated from the DC path consisting of diodes D4 and D5), and the diode D4 is isolated form the diode D5 in DC point of view.

Further, by the above-described configuration, as in the first embodiment, the bias current to obtain the same allowable transmission power can be reduced.

Eleventh Embodiment

Figure 12:
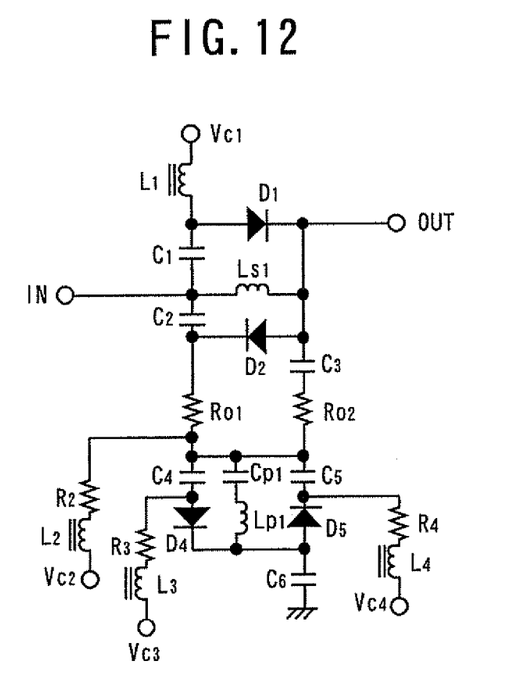
FIG. 12 shows a basic circuit configuration of a diode attenuator according to the eleventh embodiment.

FIG. 12 shows a basic circuit configuration of a diode attenuator according to the eleventh embodiment. This circuit has a circuit wherein the parallel resonating circuit using inductors shown in fifth and sixth embodiments is applied to the circuit shown in the tenth embodiment (refer to FIG. 11).

Specifically, an inductor Ls1 resonating in parallel with the diodes D1 and D2, and the first capacitor C2 and second capacitor C1 connected thereto at a predetermined frequency were inserted in parallel with the diodes D1 and D2. Further in the location parallel to the diodes D4 and D5, an inductor Lp1 and a capacitor Cp1 resonating in parallel with the diode D4 and D5, and capacitors C4 and C5 connected thereto at a predetermined frequency were serially inserted.

By the above-described configuration, in the RF passing state, insertion loss is lowered by the parallel resonance between the inductor Lp1 and the diode D4, D5, the capacitors C4 and C5. In the RF attenuating state, by the parallel resonance between the inductor Ls1, the first capacitor C2, the second capacitor C1, the diode D1 and D2, isolation between the input terminal (IN) and the output terminal (OUT) can be improved. Therefore, using the same bias current, larger attenuating state can be obtained.

Further, as in the first embodiment, the bias current to obtain the same allowable transmission power can be reduced.

Twelfth Embodiment

Figure 13:
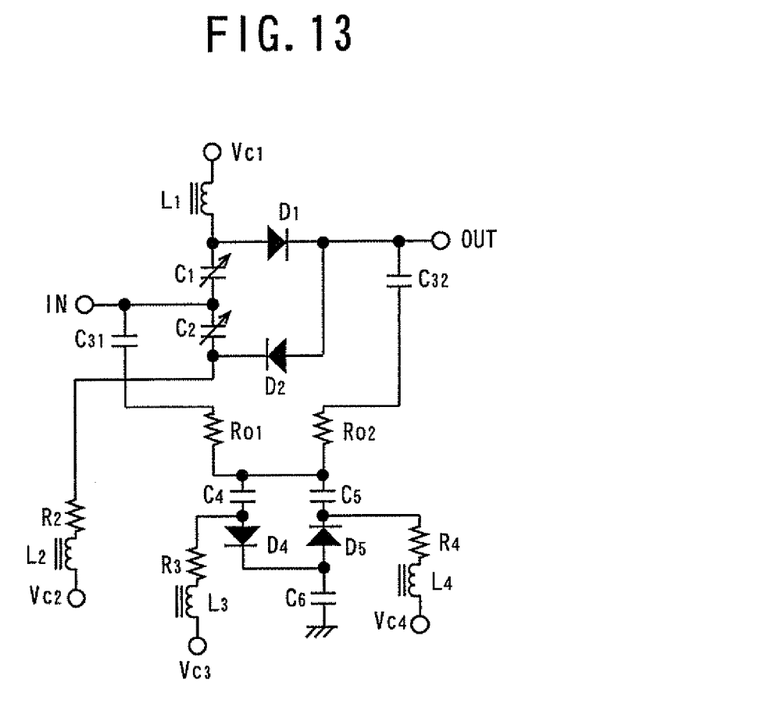
FIG. 13 shows a basic circuit configuration of a diode attenuator according to the twelfth embodiment.

FIG. 13 shows a basic circuit configuration of a diode attenuator according to the twelfth embodiment. This circuit is a circuit wherein the capacities of the first capacitor C2 and the second capacitor C1 are made to be valuable in the circuit shown in the tenth embodiment (refer to FIG. 11). Further, a resistor R01 is connected to the input terminal (IN) through a third capacitor C31, and a resistor R02 is connected to the output terminal (OUT) through a fourth capacitor C32.

By the above-described configuration, in addition to the effect of the tenth embodiment, the passing block of the diodes D1 and D2 can be completely isolated from the attenuating block of the diodes D4 and D5 also in AC point of view. Thereby, regardless of the values of C1, C2 and C3, the element constant of the attenuating block can be established.

By making the capacities of C1 and C2 variable, insertion loss in the RF passing state can also be variable. Thereby, in the same way as loading the inductor Ls1 shown in the eleventh embodiment, a larger attenuation state can be obtained in the same bias current.

Further, as in the first embodiment, the bias current to obtain the same allowable transmission power can be reduced.

Thirteenth Embodiment

Figure 14:
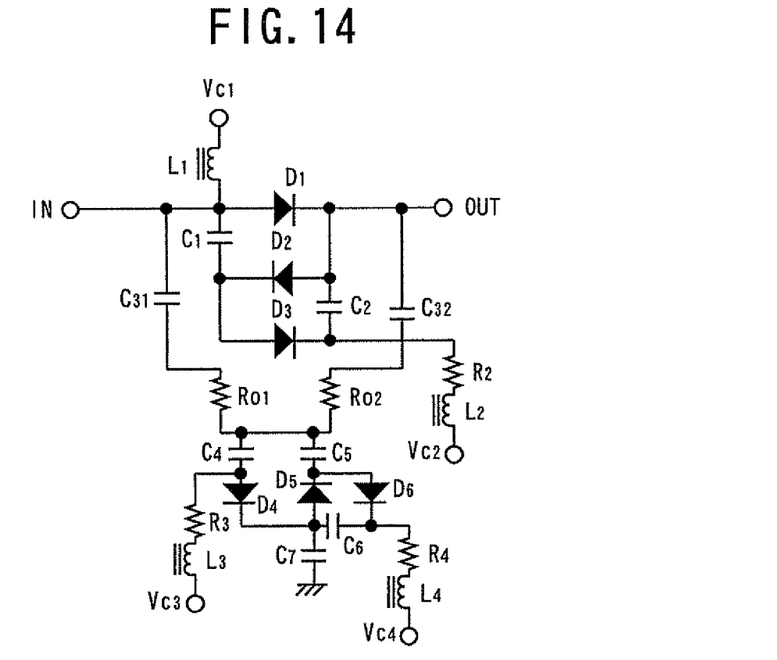
FIG. 14 shows a basic circuit configuration of a diode attenuator according to the thirteenth embodiment.

FIG. 14 shows a basic circuit configuration of a diode attenuator according to the thirteenth embodiment. This circuit is a circuit wherein a resistor R01 is connected to the input terminal (IN) through a third capacitor C31, and a resistor R02 is connected to the output terminal (OUT) through a fourth capacitor C32, in the circuit shown in the eighth embodiment (refer to FIG. 9).

By the above-described configuration, in addition to the effect of the eighth embodiment, the passing block of the diodes D1, D2 and D3 can be completely isolated from the attenuating block of the diodes D4, D5 and D6 also in AC point of view. Thereby, regardless of the values of C1, C2 and C3, the element constant of the attenuating block can be established.

Further, as in the twelfth embodiment, the bias current to obtain the same allowable transmission power can be reduced.

Fourteenth Embodiment

Figure 15:
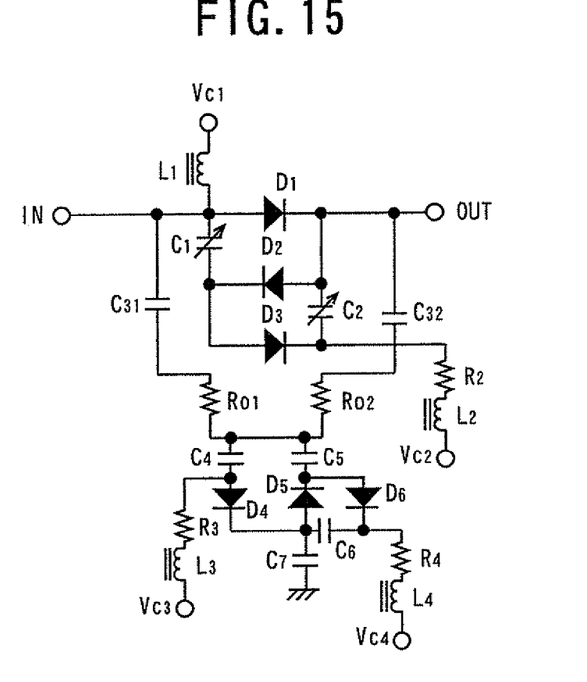
FIG. 15 shows a basic circuit configuration of a diode attenuator according to the fourteenth embodiment.

FIG. 15 shows a basic circuit configuration of a diode attenuator according to the fourteenth embodiment. This circuit is a circuit wherein the capacities of first capacitors C1 and C2 connecting the diodes D1, D2 and D3 in the passing block are made variable in the circuit shown in the thirteenth embodiment (refer to FIG. 14).

By making the capacities of C1 and C2 variable, a larger attenuation state can be obtained in the same bias current.

Further, as in the twelfth embodiment, the bias current to obtain the same allowable transmission power can be reduced.

Fifteenth Embodiment

Figure 16:
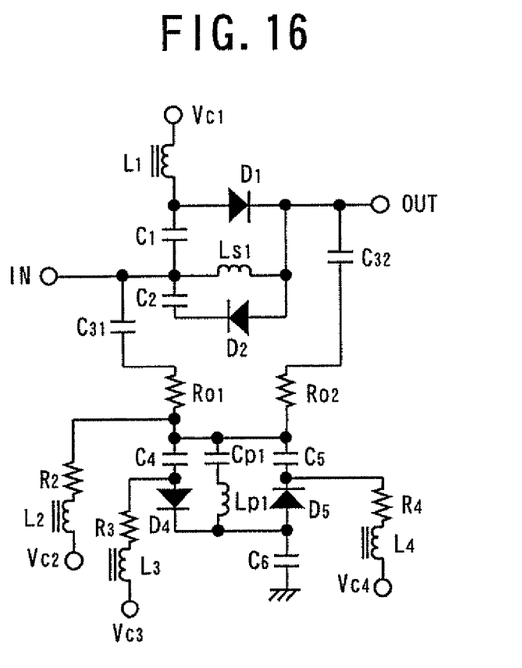
FIG. 16 shows a basic circuit configuration of a diode attenuator according to the fifteenth embodiment.

FIG. 16 shows a basic circuit configuration of a diode attenuator according to the fifteenth embodiment. This circuit is a circuit wherein a resistor R01 is connected to the input terminal (IN) through a third capacitor C31, and a resistor R02 is connected to the output terminal (OUT) through a fourth capacitor C32, in the circuit shown in the eleventh embodiment (refer to FIG. 12).

By the above-described configuration, the passing block of the diodes D1 and D2 can be completely isolated from the attenuating block of the diodes D4 and D5 also in AC point of view. Thereby, in addition to the effect of the eleventh embodiment, regardless of the values of C1, C2 and C3, the element constant of the attenuating block can be established.

Further, as in the first embodiment, the bias current to obtain the same allowable transmission power can be reduced.

Sixteenth Embodiment

Figure 17:
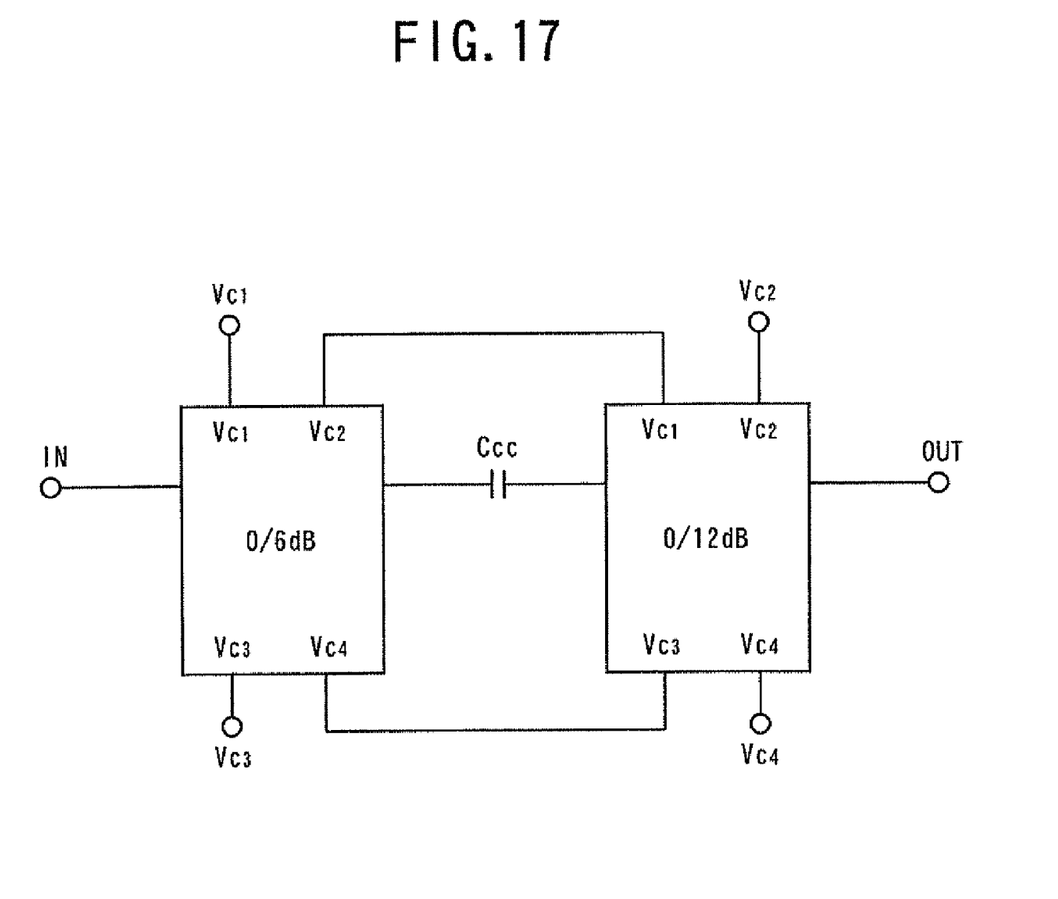
FIG. 17 shows a basic circuit configuration of a diode attenuator according to the sixteenth embodiment.

FIG. 17 shows a basic circuit configuration of a diode attenuator according to the sixteenth embodiment. In this attenuator, multiple stages of any of the attenuators shown in the eighth to fifteenth embodiments (FIGS. 9 to 16) are connected. The second control voltage terminal Vc2 of the former-stage attenuator is connected to the first control voltage terminal Vc1 of the latter-stage attenuator. The fourth control voltage terminal Vc4 of the former-stage attenuator is connected to the third control voltage terminal Vc3 of the latter-stage attenuator.

In this circuit, a 0/6 dB attenuator (former-stage attenuator) and a 0/12 attenuator (latter-stage attenuator) are vertically connected in RF point of view, and horizontally connected in DC point of view.

By the above-described configuration, the bias current of these attenuators can be shared. Specifically, while controlling increase in bias current, a multistage attenuator circuit can be constituted.

Also as in the first to fifteenth embodiments, the bias current to obtain the same allowable transmission power can be reduced compared with conventional art (refer to FIG. 19).

Seventeenth Embodiment

Figure 18:
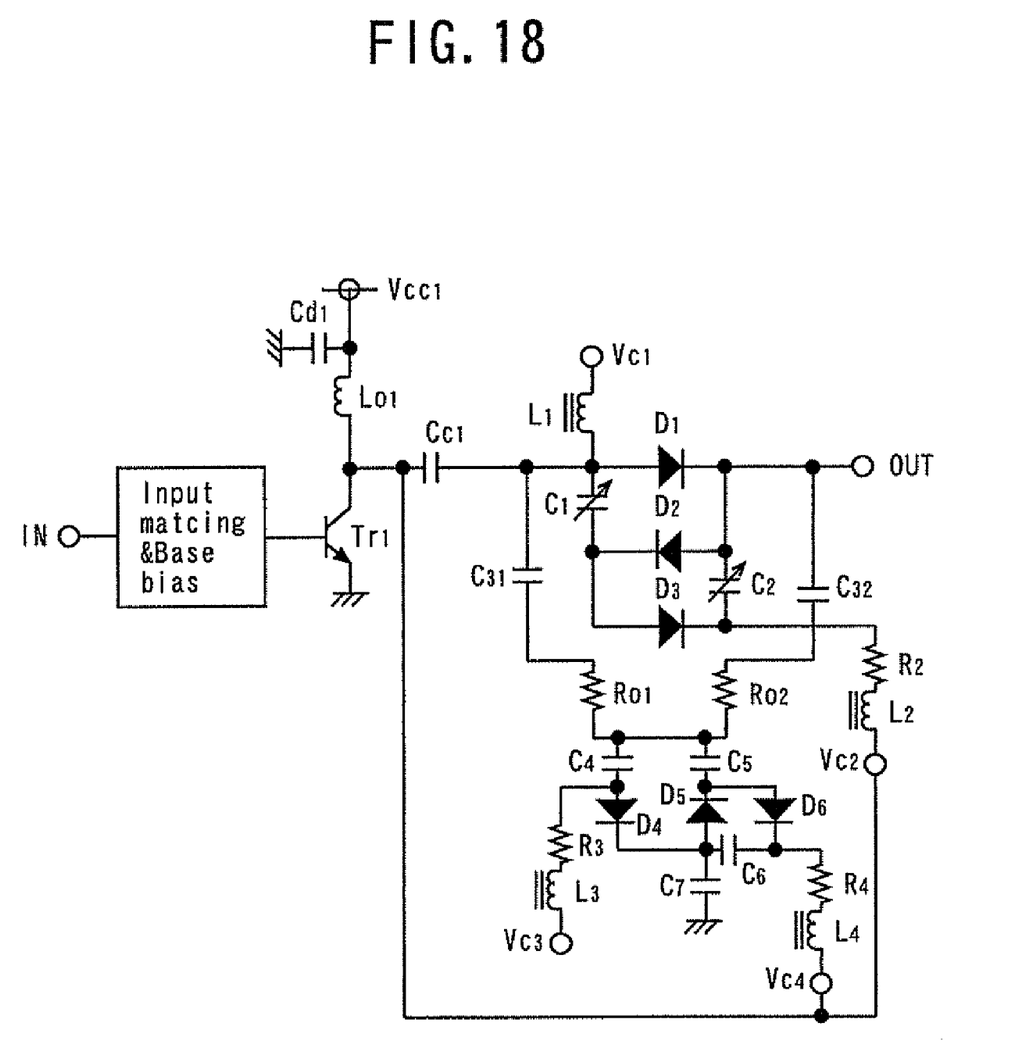
FIG. 18 shows a basic circuit configuration of a diode attenuator according to the seventeenth embodiment.

FIG. 18 shows a basic circuit configuration of a diode attenuator according to the seventeenth embodiment. This attenuator is composed of any of the attenuators shown in the eighth to fifteenth embodiments (FIGS. 9 to 16). Here, an example using the attenuator shown in the fourteenth embodiment (refer to FIG. 15). Tr1 denotes an HBT (heterojunction bipolar transistor); L01 denotes the inductor load of Tr1; Cd1 denotes bypass capacity; and Cc1 denotes a matching capacitor between Tr1 and the attenuator unit.

Tr1 is inserted between the input terminal (IN) and the first diodes D1, D2 and D3. The base of Tr1 is connected to the input terminal (IN), and the collector of Tr1 is connected to the second control voltage terminal Vc2 and the fourth control voltage terminal Vc4.

This circuit is a circuit wherein the diode switch of the present invention is combined with the output side of the RF amplifier, and the collector terminal of Tr1 is connected to the second control voltage terminal Vc2 and the fourth control voltage terminal Vc4. This circuit can also be constituted using any of attenuators shown in eighth to fifteenth embodiments (FIGS. 9 to 16).

By the above-described configuration, a part of the collector current in the operation of Tr1 can be compensated by the bias current of the attenuator. Thereby the current of the entire circuit described above can be lowered.

Also as in the first to fifteenth embodiments, the bias current to obtain the same allowable transmission power can be reduced compared with conventional art (refer to FIG. 19).

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-255573, filed on Sept. 2, 2005 including specification, claims, drawings and summary, on which the Convention priority of the present application is based, are incorporated herein by reference in its entirety.

The invention claimed is:

1. A diode switch comprising:
    an input terminal and an output terminal;
    diodes connected between said input terminal and said output terminal, each of said diodes having a cathode and an anode;
    a first capacitor; and
    a control voltage terminal connected between said input terminal and said diodes, said diode switch outputting to said output terminal an RF power input to said input terminal when a voltage at least equal to a predetermined voltage is applied to said control voltage terminal, wherein
    said diodes are arranged in a plurality of stages including a former stage including a former stage diode and a latter stage including a latter stage diode,
    the former stage and the latter stage are connected in parallel, and
    the cathode of said latter stage diode is connected to the anode of said former stage diode only through said first capacitor so that a common DC current flows through said former stage diode and said latter stage diode.

2. The diode switch according to claim 1, including an inductor serially connected to and resonating with said first capacitor at a predetermined frequency.

3. The diode switch according to claim 1, wherein said first capacitor is a variable capacitor.

4. The diode switch according to claim 3, including an inductor serially connected to and resonating with said first capacitor at a predetermined frequency.

5. The diode switch according to claim 1, including a second capacitor connected between said former stage diode and said input terminal.

6. The diode switch according to claim 5, wherein said first capacitor and said second capacitor are variable capacitors.

7. An attenuator comprising:
an input terminal and an output terminal;
a first plurality of diodes connected between said input terminal and said output terminal;
a first control voltage terminal connected between said input terminal and said first plurality of diodes;
a resistance element connected to said first plurality of diodes;
first and second capacitors; and
a second control voltage terminal and a second plurality of diodes connected to said resistance element, each of said diodes of said first and second plurality of diodes having a cathode and an anode, said attenuator outputting to said output terminal an RF power input to said input terminal, after attenuation, when a voltage at least equal to a first predetermined voltage is applied to said first control voltage terminal, and a voltage at least equal to a second predetermined voltage is applied to said second control voltage terminal, wherein
diodes of said first plurality of diodes are arranged in a plurality of stages, including a former stage including a former stage diode and a latter stage including a latter stage diode,
the former stage and the latter stage are connected in parallel,
the cathode of the latter stage diode is connected to the anode of the former stage diode through said first capacitor so that a common DC current flows through said former stage diode and said latter stage diode,
said second plurality of diodes are arranged in a plurality of stages including a former stage including a former stage diode and a latter stage including a latter stage diode,
the former stage and latter stage of said second plurality of diodes are connected in parallel, and
said second plurality of diodes are connected to said resistance element through said second capacitor so that a common DC current flows through said former stage diode and said latter stage diode of said second plurality of diodes.

8. The attenuator according to claim 7, including
a first inductor serially connected to and resonating with said first capacitor at a predetermined frequency, and
a second inductor connected in parallel and resonating with said second plurality of diodes and said second capacitor at a predetermined frequency.

9. The attenuator according to claim 7, including third and fourth capacitors, wherein said resistance element is connected to said input terminal through said third capacitor and connected to said output terminal through said fourth capacitor.

10. The attenuator according to claim 9, wherein said first capacitor is a variable capacitor.

11. The attenuator according to claim 7, including a third capacitor connected between said former stage diode of said first plurality of diodes and said input terminal.

12. The attenuator according to claim 11, including fourth and fifth capacitors, wherein said first capacitor and said third capacitor are variable capacitors, and said resistance element is connected to said input terminal through said fourth capacitor and connected to said output terminal through said fifth capacitor.

13. The attenuator according to claim 11, including:
a first inductor connected in parallel and resonating with said first plurality of diodes, said first capacitor, and said third capacitor at a predetermined frequency, and
a second inductor connected in parallel and resonating with said second plurality of diodes and said third capacitor at the predetermined frequency.

14. The attenuator according to claim 13, including fourth and fifth capacitors wherein said resistance element is connected to said input terminal through said fourth capacitor and connected to said output terminal through said fifth capacitor.

* * * * *